(12) United States Patent
Nagasawa et al.

(10) Patent No.: US 7,726,715 B2
(45) Date of Patent: Jun. 1, 2010

(54) VACUUM SUCTION HEAD

(75) Inventors: Shigeki Nagasawa, Suita (JP); Kiyoshi Takamatsu, Suita (JP)

(73) Assignee: Mitsuboshi Diamond Industrial Co., Ltd., Osaka (JP)

( * ) Notice: Subject to any disclaimer, the term of this patent is extended or adjusted under 35 U.S.C. 154(b) by 0 days.

(21) Appl. No.: 10/543,726

(22) PCT Filed: Jan. 28, 2004

(86) PCT No.: PCT/JP2004/000785

§ 371 (c)(1),
(2), (4) Date: Dec. 27, 2005

(87) PCT Pub. No.: WO2004/067234

PCT Pub. Date: Aug. 12, 2004

(65) Prior Publication Data

US 2006/0232085 A1 Oct. 19, 2006

(30) Foreign Application Priority Data

Jan. 29, 2003 (JP) .............................. 2003-020620

(51) Int. Cl.
B25J 15/06 (2006.01)

(52) U.S. Cl. .................................................... 294/64.1

(58) Field of Classification Search ................ 294/64.1, 294/64.3; 248/205.8, 205.9, 362
See application file for complete search history.

(56) References Cited

U.S. PATENT DOCUMENTS

| | | | | |
|---|---|---|---|---|
| 2,221,238 A | * | 11/1940 | Johnson .................... | 248/205.5 |
| 2,850,279 A | * | 9/1958 | Stoothoff et al. ............ | 271/103 |
| 3,272,549 A | * | 9/1966 | Nisula ........................ | 294/64.1 |
| 4,600,229 A | | 7/1986 | Oten | |
| 4,736,749 A | * | 4/1988 | Lundback .................... | 600/387 |
| 5,013,075 A | * | 5/1991 | Littell ........................ | 294/64.1 |
| 5,133,524 A | * | 7/1992 | Liu ........................... | 248/205.8 |
| 5,192,070 A | * | 3/1993 | Nagai et al. ................. | 294/64.1 |
| 5,336,158 A | * | 8/1994 | Huggins et al. ............... | 601/46 |
| 5,345,935 A | * | 9/1994 | Hirsch et al. ................. | 600/376 |
| 5,511,752 A | * | 4/1996 | Trethewey ............... | 248/205.9 |
| 6,042,647 A | * | 3/2000 | Kawakami et al. .......... | 118/320 |

(Continued)

FOREIGN PATENT DOCUMENTS

DE        2547289        * 12/1984        ................ 294/64.1

(Continued)

*Primary Examiner*—Paul T Chin
(74) *Attorney, Agent, or Firm*—McGlew and Tuttle, P.C.

(57) ABSTRACT

An etchable plate-shaped material is used as a vacuum suction pad 31. On one surface thereof, a large number of independent protruded portions and recessed portions are formed to provide a suction part 33b. Further, a periphery of the suction part is annularly formed to provide an airtight part 33a. When the vacuum suction pad 31 comes close to a substrate to be sucked, a skirt pad 32 with a slit 32d is integrally formed in the shape of a hemmed hat using an elastic member, in order to block outside air into a peripheral space of the vacuum suction pad 31. With this arrangement, it is possible to prevent the substrate from being locally deformed when the substrate is sucked by discharging air from a suction port 36 and to widen a clearance between the vacuum suction pad and the substrate such as a liquid crystal panel, at which the suction is possible.

10 Claims, 16 Drawing Sheets

U.S. PATENT DOCUMENTS

| | | |
|---|---|---|
| 6,135,522 A | 10/2000 | Su et al. |
| 6,527,323 B2 * | 3/2003 | Nagai et al. ............... 294/64.1 |

FOREIGN PATENT DOCUMENTS

| | | |
|---|---|---|
| DE | 40 26 244 A1 | 2/1992 |
| DE | 295 12 750 U1 | 7/1996 |
| DE | 100 09 108 A1 | 9/2001 |
| EP | 0 302 221 A1 | 2/1989 |
| EP | 0 385 761 A1 | 9/1990 |
| EP | 1 088 624 A2 | 4/2001 |
| JP | 128530/1976 | 4/1978 |
| JP | 56-126595 | 10/1981 |
| JP | 64004585 U | 1/1989 |
| JP | 6074286 | 10/1994 |
| JP | 7-267410 | 10/1995 |
| JP | 8-122941 | 5/1996 |
| JP | 8-197470 | 8/1996 |
| JP | 9-174475 | 7/1997 |
| JP | 11-267986 | 10/1999 |

* cited by examiner

F I G. 7
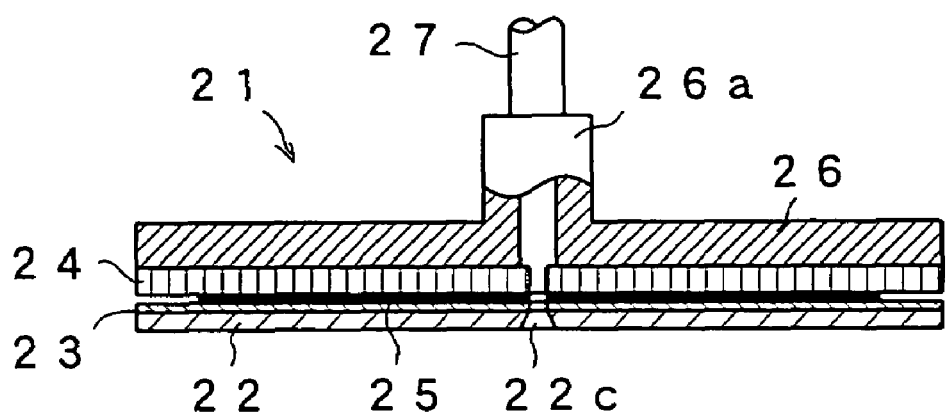
F I G. 8
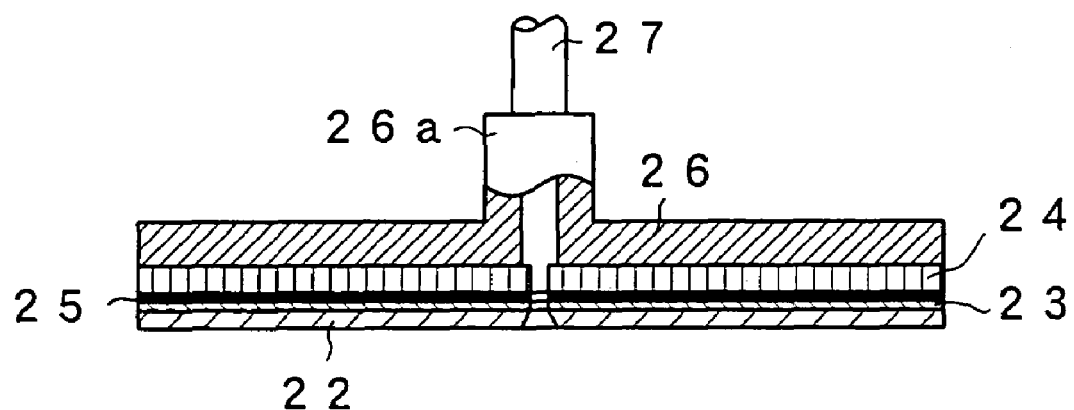

F I G. 9
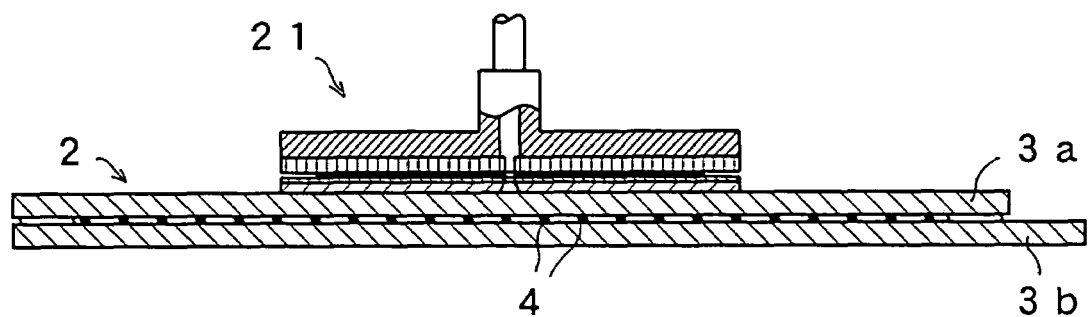

F I G. 1 0
(a)
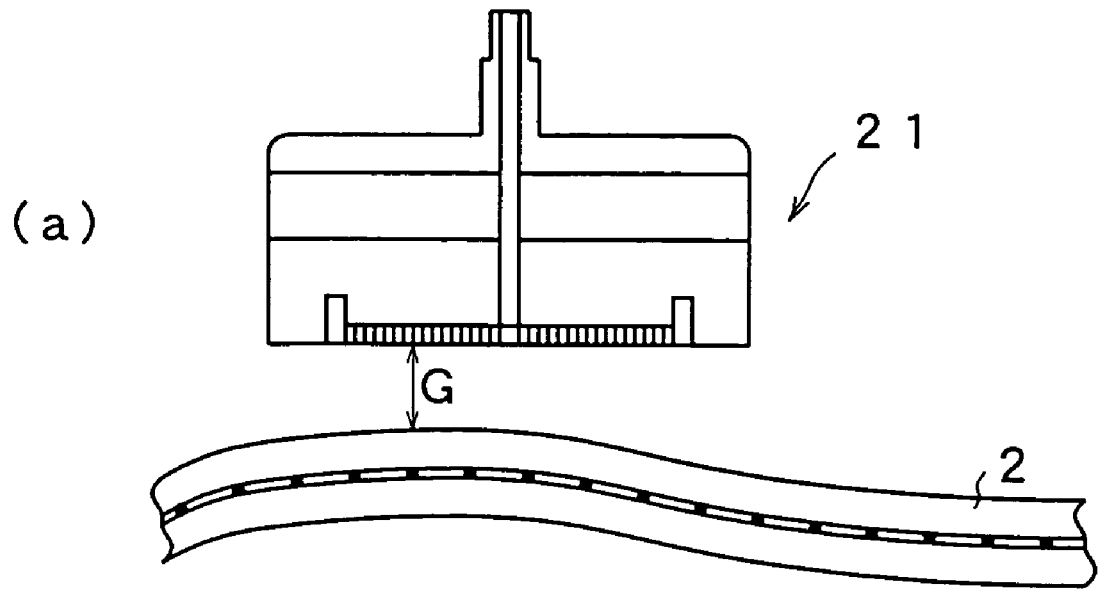
(b)
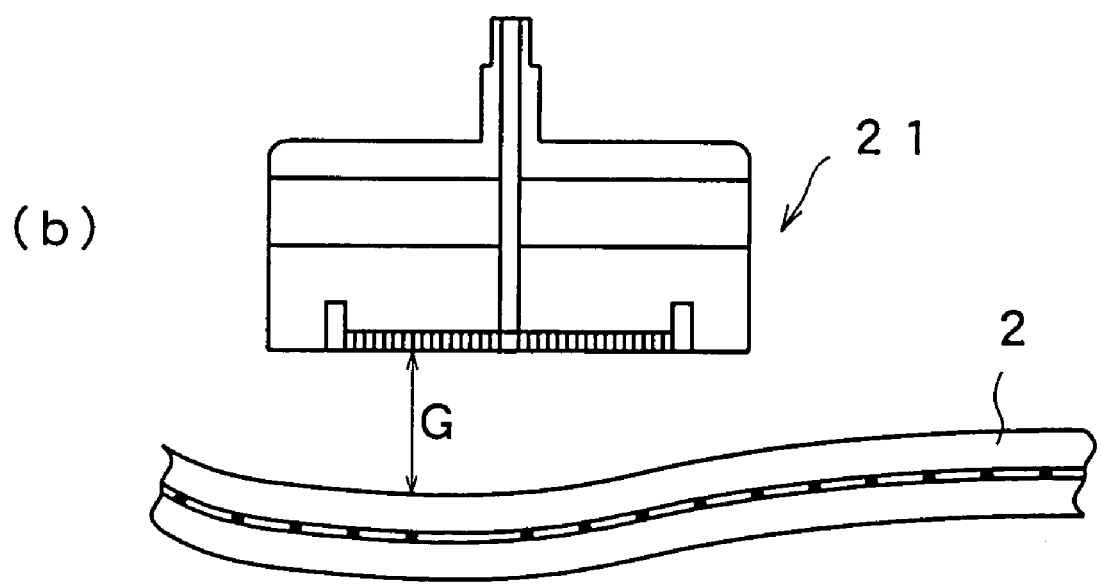

US 7,726,715 B2

VACUUM SUCTION HEAD

CROSS REFERENCE TO RELATED APPLICATIONS

This application is a United States National Phase application of International Application PCT/JP2004/000785 filed Jan. 28, 2004 and claims the benefit of priority under 35 U.S.C. §119 of JP 2003-020620 filed Jan. 29, 2003, the entire contents of which are incorporated herein by reference.

TECHNICAL FIELD

The present invention relates to a vacuum suction head for holding and sucking a substrate when conveyed. The substrate herein means a single-plate semiconductor wafer, a ceramic substrate, a glass substrate, a plastic substrate, a transmissive-type projector substrate which is a laminated substrate, PDP (plasma display) which is a flat panel display, a reflective-type liquid crystal projector substrate, a liquid crystal panel, an organic EL element substrate, and the like. Herein, a glass substrate and the like having a small thickness are called brittle material substrates. In the following, description will be given using the liquid crystal panel as an example.

BACKGROUND ART

A conveyor robot or the like is used for supplying and removing a material to and from a substrate processing device and the like. FIG. 1 shows a vacuum suction pad 1 of a first conventional example for conveying a substrate for use in a vacuum suction device of the conveyor robot, and a liquid crystal panel 2, which is a laminated substrate formed by bonding substrates to be sucked together. As is well known, the liquid crystal panel 2 is formed in such a manner that, after two glass substrates 3a and 3b are superposed with particulate spacers 4 interposed therebetween, peripheral edges of the glass substrates 3a and 3b are fixed by using an adhesive (sealant) 5, followed by injection of liquid crystal through a pore provided in a layer of the adhesive (sealant) 5. The vacuum suction pad 1 includes a rubber suction disk 1a formed like an upside down bowl and a suction tube 1b provided in a penetrating position through the top of the suction disk 1a.

FIG. 2 shows a state where a lower edge peripheral portion 1c of the suction disk 1a is brought into press-contact with an upper surface of the liquid crystal panel 2 to perform vacuum suction through the suction tube 1b. By this vacuum suction, a vacuum-sucked place of the upper glass substrate 3a might be locally deformed upward to cause an increase in a gap between the upper and lower glass substrates in this place, thereby temporally lowering pressure. In this case, the liquid crystal flows, as if concentrated, into this place. The spacers 4 with a diameter of, for example, 5 to 10 μm are inserted so as to have a uniform density of about 100 particles/mm². However, being unfixed to the glass substrates 3a and 3b, the spacers 4 move along with the movement of the liquid crystal. When no liquid crystal has been injected into the liquid crystal panel 2, air flow into a place where pressure has been lowered. In this case, because the resistance to the movement of the spacers 4 is small, the movement of the spacers 4 is further contributed.

Consequently, after the suction by the vacuum suction pad 1, dispersion in the distribution of the spacers 4 has occurred, and corresponding to this dispersion, variations in the gap between the upper and lower glass substrates have occurred, as shown in FIG. 3. Further, although not shown in the figure, there recently exists a liquid crystal panel of the type obtained by bonding two glass substrates together without spacers, and this spacer-free type liquid crystal panel is configured in a state where the spacers 4 are not inserted into the liquid crystal panel 2 in FIGS. 1 to 3. Also in the case this spacer-free type liquid crystal panel is vacuum-sucked by the suction disk 1a, the upper glass substrate 3a is locally deformed upward, and once deformed, it does not changed back into the original form, thereby causing variations in the gap between the upper and lower glass substrates. If the gap between the upper and lower glass substrates of the liquid crystal panel varies by 0.04 mm or more, a color shading appears on the display surface, with which the liquid crystal panel becomes defective as a product.

As thus described, in the first conventional example, the deformation of the upper glass substrate occurs when the vacuum suction pad 1 vacuum-sucks the liquid crystal panel 2, caused by too large a diameter of the suction disk 1a as compared to the thickness of the glass substrate and the size of the spacer 4. The diameter of the suction disk 1a is several tens of mm while the thickness of the glass substrate is 0.5 to 1.1 mm, and a thin glass substrate tends to be selected.

In the vacuum suction pad 1 of FIG. 1, suction force becomes insufficient if the size of the suction disk 1a is reduced for the purpose of avoiding the problems of the local deformation of the suction surface of the glass substrate, the variations in the gap between the glass substrates due to the suction by the vacuum suction pad 1 and the problem of the dispersion in the distribution, which results from the local deformation and the variations in the gap, of the spacers 4. To this end, as shown in FIG. 4, there is a method for providing a plurality of vacuum suction pads 1 each having a small suction disk to suck the liquid crystal panel 2. In this case, it is necessary to attach all the vacuum suction pads 1 to the vacuum suction device such that the suction surface of each of the vacuum suction pads 1 is provided within a prescribed attachment tolerance range in order to prevent the vacuum suction pads 1 from pressing the glass substrate surface. Further, also in the case the liquid crystal panel 2 to be sucked is swollen or bent, it is necessary to set the suction surface of each of the vacuum suction pads 1 within a clearance at which the suction of the liquid crystal panel 2 is possible.

If the plurality of vacuum suction pads 1 are attached to the vacuum suction device with the suction surfaces thereof out of the above-mentioned attachment tolerance range, the liquid crystal panel 2 is conveyed while imperfectly sucked, whereby the liquid crystal panel 2 might drop when conveyed, or might be pressed by the vacuum suction pad 1 when sucked to cause occurrence of variations in the gap between the upper and lower glass substrates, leading to occurrence of product defect.

FIG. 5 is an exploded view showing a structure of a vacuum suction pad 21 in a second conventional example, shown in JP-A 11-019838. A suction disk 22 of the vacuum suction pad 21 is formed into a disk shape and is made of a photosensitive resin material, a central portion of which is provided with a vertically penetrating suction port 22c, and a suction surface of the suction disk 22 is provided with a large number of protruded portions and recessed portions, as described later. These large number of protruded portions and recessed portions are formed by etching the photosensitive resin material.

FIG. 6 shows the structure of the suction surface of the suction disk 22 in the vacuum suction pad 21, and FIG. 7 shows a cross-sectional view of the vacuum suction pad 21. The suction disk 22 has an airtight part 22a at a peripheral portion thereof with a flat surface, and a suction part 22b where a large number of protruded portions and recessed portions are formed. As shown in FIG. 7, a reinforcement layer 23 is a layer made of a large rigid plate material so as to prevent the photosensitive resin material from being deformed due to an external stress, and is bonded to the photosensitive resin material in the stage of manufacturing the photosensitive resin material into a plate-making material. A magnet sheet 24 is a sheet with the same diameter as that of the suction disk 22. A double-faced adhesive sheet 25 is an adhesive sheet for joining the magnet sheet 24 and the reinforcement sheet 23 together, and has the same diameter as that of the suction part 22b on the suction disk 22. A hole Q is formed in a position corresponding to the suction port 22c, in each of those members 23 to 25.

In the case of making the diameter of the double-faced adhesive sheet 25 equivalent to the diameter of the suction part 22b, as shown in FIG. 7, only the suction part 22b on the suction disk 22 is fixed to a supporting member 26 via the magnet sheet 24. Meanwhile, the airtight part 22a is not fixed and stays free. FIG. 8 shows an example where the diameter of the double-faced adhesive sheet 25 is made equivalent to that of the suction disk 22, and in this case, the whole surface of the suction disk 22 is fixed to the supporting member 26.

Turning back to FIG. 6, an expanded view X of the peripheral portion of the suction disk 22 is referred to. The airtight part 22a is a region where the photosensitive resin material is not etched. In the suction part 22b, a large number of small-circular regions are non-etching portions (protruded portions) and the regions other than the protruded portions are etching portions (recessed portions). As shown in the expanded view X in FIG. 6, the small circular places are left as protruded portions M and the other places become recessed portions N. Herein, the protruded portions M and the airtight part 22a are both non-etching portions and thus positioned on the same surface.

The supporting member 26 is an iron material having the same diameter as that of the magnet sheet 24, and a supporting part 26a is integrally formed at a central portion corresponding to the suction port 22c of the suction disk 22. A suction tube 27 is inserted through the supporting part 26a and is connected to a vacuum pump (not shown). The suction disk 22 is integrally joined with the reinforcement layer 23, the double-faced adhesive sheet 25 and the magnet sheet 24, and is made attachable to/detachable from the supporting member 26 by the action of the magnet sheet 24.

When the vacuum suction pad 21 as thus configured is brought into press-contact with the flat liquid crystal panel 2, the recessed portions N in the suction part 22b on the suction disk 22 form closed spaces with the airtight part 22a, and since the protruded portions M are independent of one another, the suction port 22c of the suction disk 22 is communicated with the closed spaces as shown in FIG. 5, whereby the vacuum suction is performed using the foregoing vacuum pump (not shown) through the suction port 22c, allowing the suction disk 22 to be sucked to the liquid crystal panel 2.

FIG. 9 is a cross-sectional view showing a state of sucking a liquid crystal panel 2 having a small outer shape with the use of the foregoing vacuum suction pad 21 of the second conventional example. In this case, in order to hold the substrate, one vacuum suction pad 21 is used for the vacuum suction device to be installed in a conveyor robot or the like, and the size of the liquid crystal panel 2 is in such a degree as to be slightly larger than that of the vacuum suction pad 21. When the liquid crystal panel 2 is made to be sucked by the vacuum suction pad 21, the large number of protruded portions M formed on the same surface as the airtight part 22a in the expanded view X of FIG. 6 are brought into contact with the upper surface of the upper glass substrate 3a in the liquid crystal panel 2, which can prevent local deformation of the upper glass substrate 3a in the liquid crystal panel 2, and hence variations in the gap between the upper glass substrate 3a and the lower glass substrate 3b does not occur. Moreover, also in the case of the liquid crystal panel of which the gap is formed without insertion of the spacers, no variations in the gap between the upper and lower glass substrates occur. It should be noted that, in the case the suction disk 22 itself is sufficiently flexible, the vacuum suction pad 21 may be a vacuum suction pad of the type obtained by fixing the whole surface of the suction disk 22 with the double-faced adhesive sheet 25, as shown in FIG. 8.

In the case the liquid crystal panel for use in individual display devices has a small shape, a mother liquid crystal panel is segmented to manufacture a plurality of liquid crystal panels of a prescribed size. An example of such a panel is a liquid crystal panel to be used for mobile phones, personal digital assistances (PDAs) and the like. On the other hand, in the case of a liquid crystal panel having a large outer shape, a plurality of vacuum suction pads are used as in the vacuum suction devices shown in FIG. 4.

In the case one vacuum suction device is provided with a plurality of vacuum suction pads, when the vacuum suction pad 1 of the first conventional example is used as shown in FIG. 4, as described above, in the liquid crystal panel, the local deformation of the upper glass substrate occurs and dispersion in the distribution of the foregoing spacers occurs caused by the local deformation, to bring about occurrence of product defect. For this reason, the vacuum suction pad 21 of the second conventional example is used.

There exists a distance (clearance) at which the vacuum suction pad can suck the liquid crystal panel. In the vacuum suction pad 21 having the structure shown in FIG. 5, air is discharged through the suction tube 27. At this time, the vacuum suction pad 21 sucks the air in front thereof so as to suck the liquid crystal panel. A distance from the surface of the upper glass substrate in the liquid crystal panel to the suction disk 22 of the vacuum suction pad 21 at this time is referred to as a clearance at which the suction is possible. The conventional clearance is 0.0 to 0.3 mm, and since the adequate range is very narrow, it has been very difficult to maintain the clearance and also to adjust the same.

As shown in FIGS. 10(a) and (b), with the liquid crystal panel 2 swollen or bent, even if a plurality of vacuum suction pads 21 are provided in the vacuum suction device within a prescribed attachment tolerance range, there have been cases where the clearance G between the upper surface of the liquid crystal panel 2 and the vacuum suction pad 21 exceed the clearance at which the suction of the vacuum suction pad 21 is possible. In such a case, any one of the plurality of vacuum suction pads 21 cannot suck the liquid crystal panel 2 in a regular state, and the liquid crystal panel 2 is conveyed while imperfectly sucked, which might result in that the liquid crystal panel 2 drops when conveyed, or since the vacuum suction pad 21 presses the liquid crystal panel 2 in sucking the liquid crystal panel 2, the upper glass substrate in the liquid crystal panel 2 is locally deformed to lead to occurrence of variations in the gap between the upper and lower glass substrates.

The present invention has been made to solve the above-mentioned problems, and an object thereof is to provide a vacuum suction head, comprising a vacuum suction pad which can hold a substrate being swollen or bent without making the substrate defective, widen a clearance between the vacuum suction pad and the substrate at which the suction is possible during the suction, and prevent local deformation of the substrate due to the suction as well as preventing occurrence of variations in the gap between the upper and lower glass substrates caused by the local deformation in the case of the laminated substrate such as a liquid crystal panel.

DISCLOSURE OF INVENTION

The present invention provides a vacuum suction head for vacuum-sucking a substrate, comprising: a vacuum suction pad which is made of a plate-shaped material and is provided with a suction part where a large number of independent protruded portions and recessed portions are formed on one surface thereof, an airtight part annularly formed in a peripheral position of the plate-shaped material surrounding the suction part, a groove part serving as a passage for discharging air from the suction part, and an opening for discharging the air from the groove part to the outside; and an elastic member which is formed so as to take in the vacuum suction pad, and blocks outside air from a peripheral space of the vacuum suction pad when the vacuum suction pad comes close to a substrate to be sucked, wherein the elastic member also has a function of leaking air from the outside of the elastic member into the inside thereof.

Herein, the elastic member may be a skirt pad formed into a skirt shape, and include: a plate part which supports the vacuum suction pad from behind a suction surface; an annular part which is formed into a thick annular shape on an outer edge of the plate part so as to surround a peripheral portion of the vacuum suction pad via a prescribed gap; and a skirt part which is formed into a conically annular shape by making a thickness of the skirt part smaller than that of a peripheral portion of the annular part.

This skirt pad may communicate the outside of the annular part with the inside space, and provide a slit in the annular part, for leaking air from the outside into the inside space when there is a large a difference in pressure between the outside and the inside space.

Further, the elastic member may be a cylindrically formed sponge pad, and the elastic member may be formed into a cylindrical shape using an open foam sponge member so as to block a peripheral space of the vacuum suction pad from outside air when the vacuum suction pad comes close to the substrate to be sucked, and leak air from the outside into the inside when there is a difference in pressure between the outside and the inside space in the blocked state.

The suction part of the vacuum suction pad may be formed on one surface of an etchable plate-shaped member by forming a large number of independent protruded portions and recessed portions by etching, and the airtight part may be annularly formed on the peripheral portion of the plate-shaped member as a non-etching region.

The vacuum suction pad may be made of a photosensitive resin material which can be selectively etched with the use of ultraviolet irradiation and a solvent.

BRIEF DESCRIPTION OF DRAWINGS

FIG. 7 is a cross-sectional view showing the structure of the suction disk in the vacuum suction pad of the second conventional example.

FIG. 8 is a cross-sectional view showing the case where a diameter of a double-faced adhesive sheet is made equivalent to the diameter of the suction disk in the vacuum suction pad of the second conventional example.

FIG. 9 is a cross-sectional view showing a state where a liquid crystal panel having a small outer shape is sucked using the vacuum suction pad of the second conventional example.

FIGS. 10(a) and 10(b) are explanatory views each showing a clearance between the vacuum suction pad and a liquid crystal panel with a bent portion in the second conventional example.

BEST MODE FOR CARRYING OUT THE INVENTION

Embodiment 1

Figure 11:
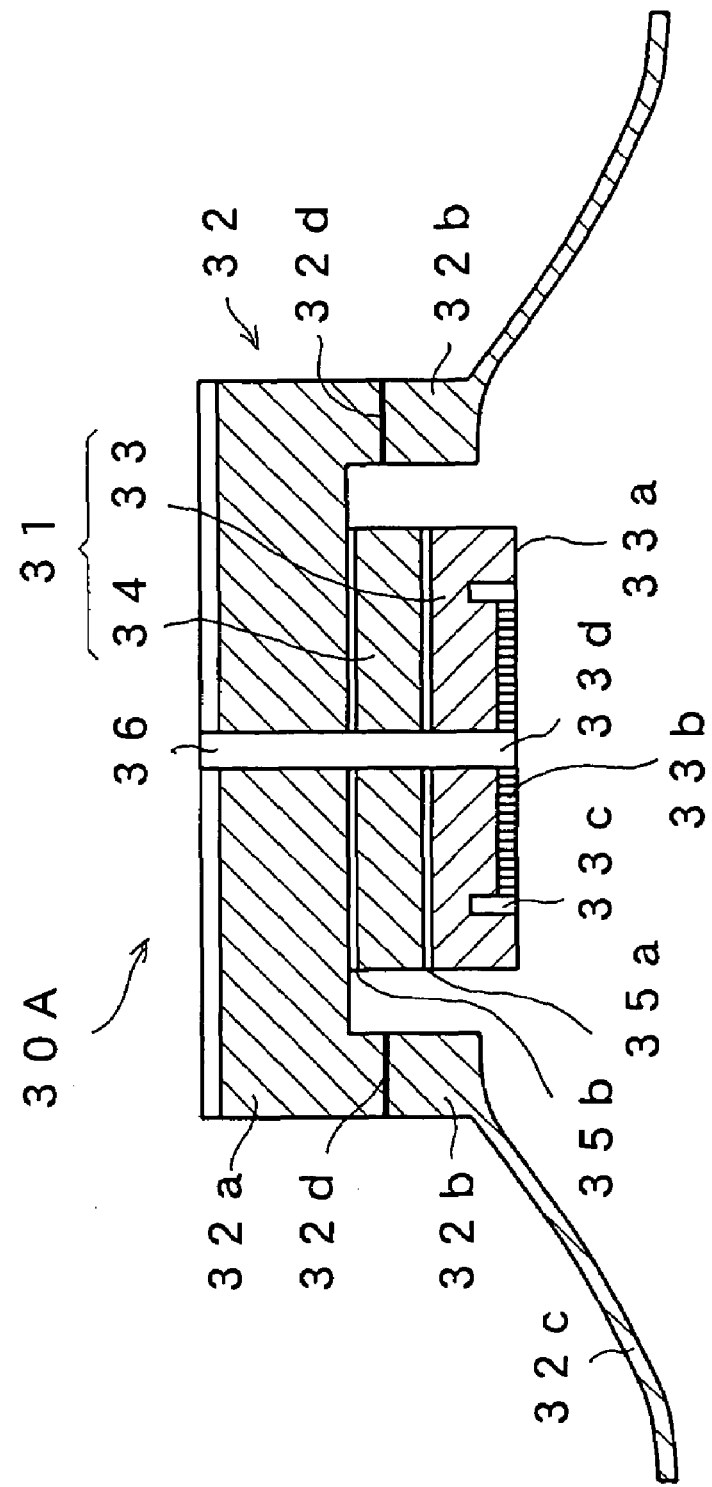
FIG. 11 is an end view showing a structure of a vacuum suction head in Embodiment 1 of the present invention.
Figure 12:
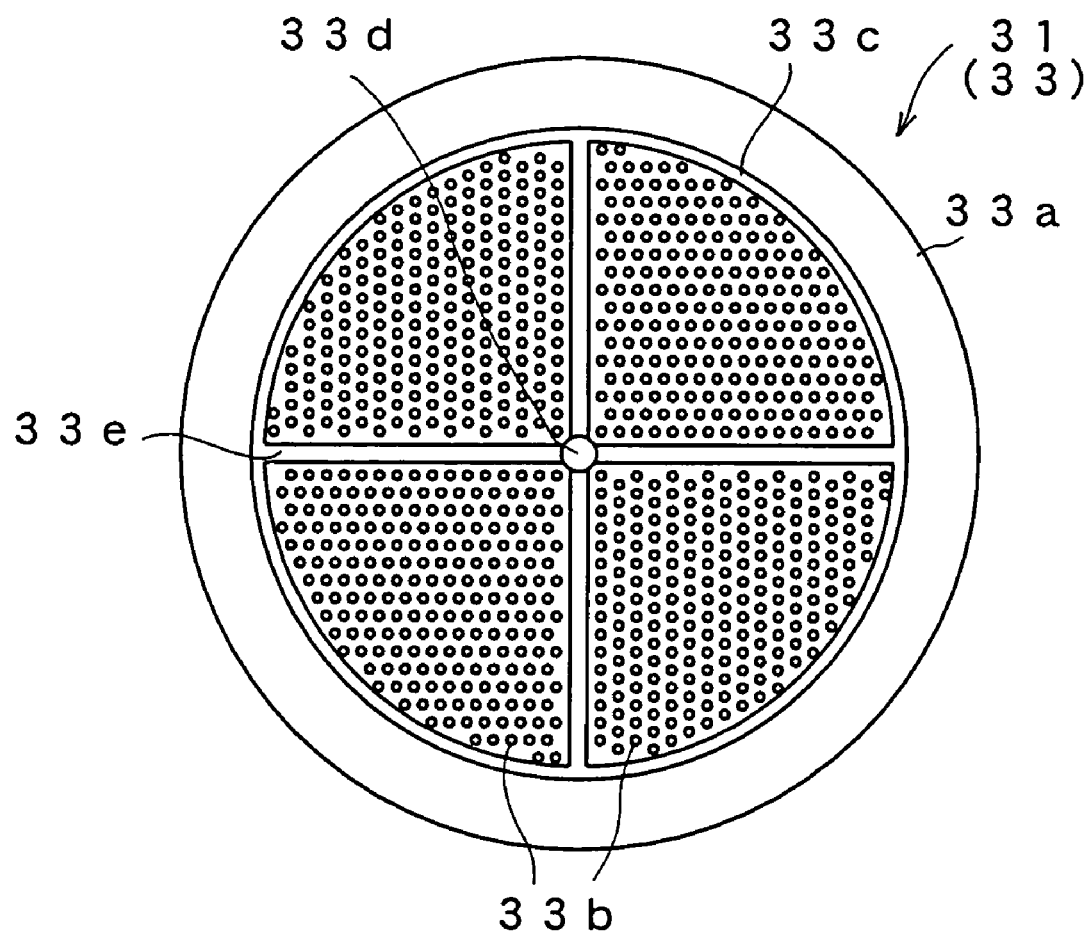
FIG. 12 is a plan view of the structure of the suction surface of the vacuum suction head in Embodiment 1 of the present invention.

A vacuum suction head in Embodiment 1 of the present invention will be described with reference to the drawings. A substrate herein means a single-plate semiconductor wafer, a ceramic substrate, a glass substrate, a plastic substrate, a transmissive-type projector substrate which is a laminated substrate, PDP (plasma display) which is a flat panel display, a reflective-type liquid projector substrate, a liquid crystal panel, an organic EL element substrate and the like. While the vacuum suction head of the present invention is effectively applicable to a liquid crystal panel and a mother liquid crystal panel with no spacer inserted therein, an example of a liquid crystal panel with spacers inserted therein will be described herein. FIG. 11 is an end view showing a structure of a vacuum suction head 30A in Embodiment 1. The vacuum suction head 30A includes a vacuum suction pad 31 and a skirt pad 32. FIG. 12 is a plan view showing a structure of a suction surface (suction disk 33) of the vacuum suction pad 31.

Figure 1:
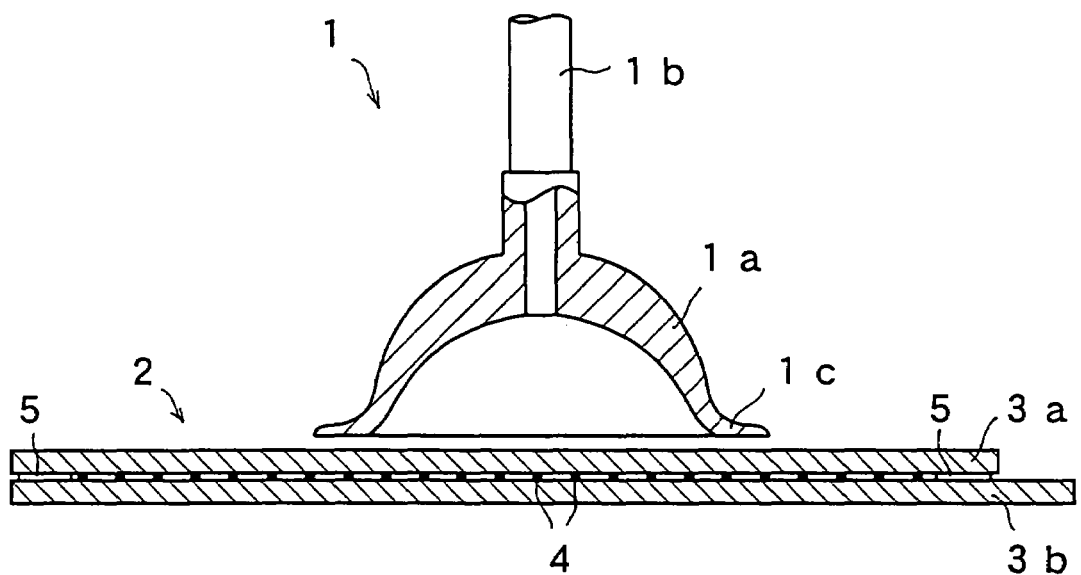
FIG. 1 is a cross-sectional view showing a positional relation between a vacuum suction pad of a first conventional example and a liquid crystal panel which is a brittle material substrate to be sucked.
Figure 2:
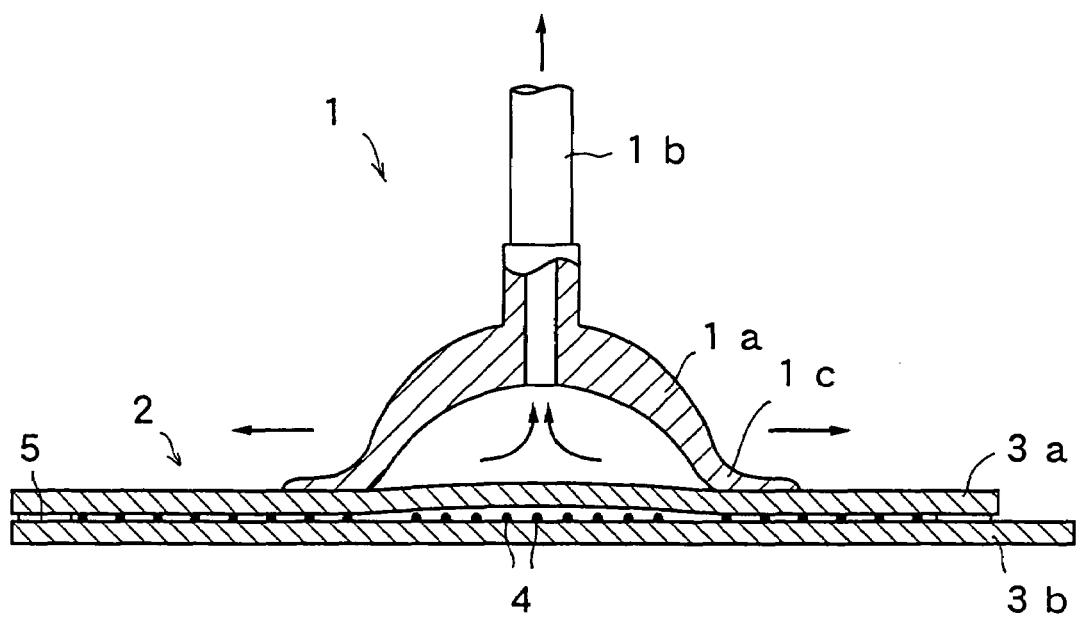
FIG. 2 is a cross-sectional view showing a state where a lower edge peripheral portion of a suction disk is brought into press-contact with an upper surface of the liquid crystal panel to perform vacuum suction through a suction tube in the vacuum suction pad of the first conventional example.
Figure 3:
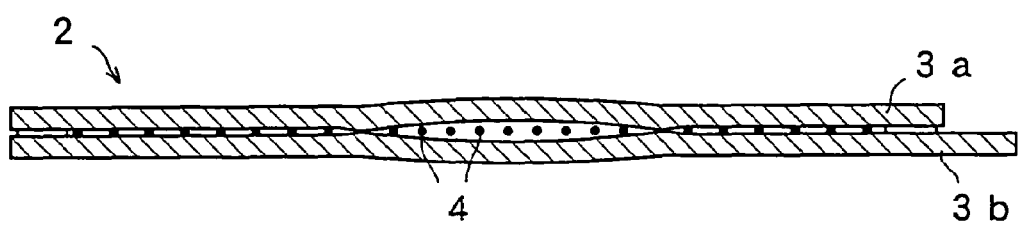
FIG. 3 is an explanatory view showing a state where dispersion in the distribution of spacers has occurred after suction and variations in the gap between glass substrates has also occurred according to the dispersion in the distribution in the case of using the vacuum suction pad of the first conventional example.
Figure 4:
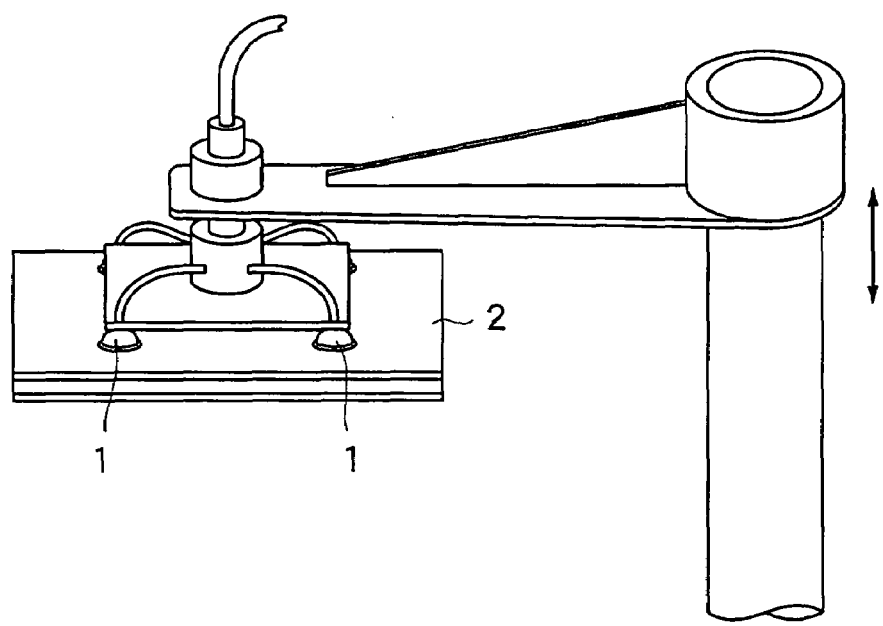
FIG. 4 is an external view showing a configuration of a vacuum suction device of a conventional example provided with a plurality of vacuum suction pads.
Figure 5:
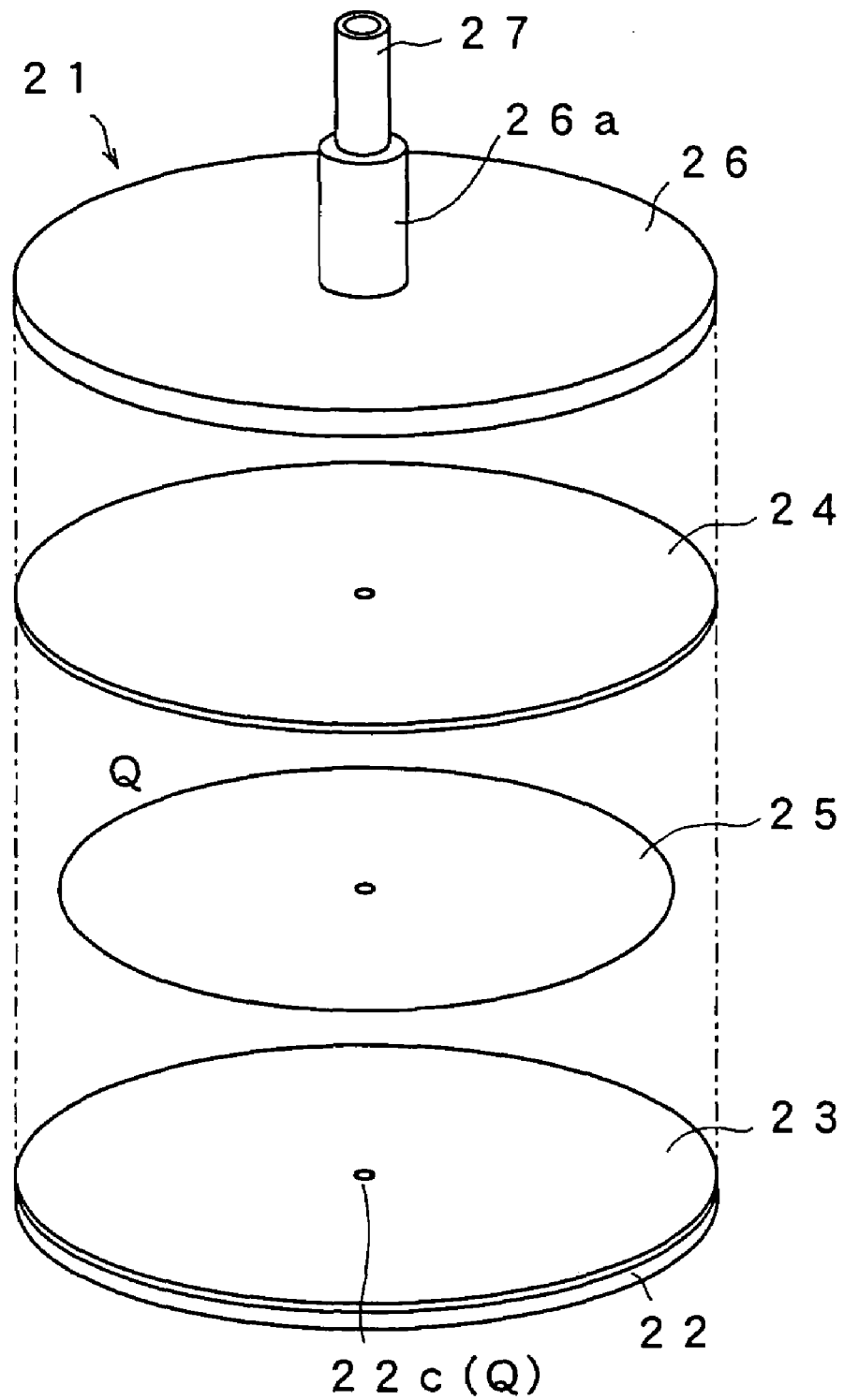
FIG. 5 is an exploded perspective view showing a structure of a vacuum suction pad in a second conventional example.
Figure 6:
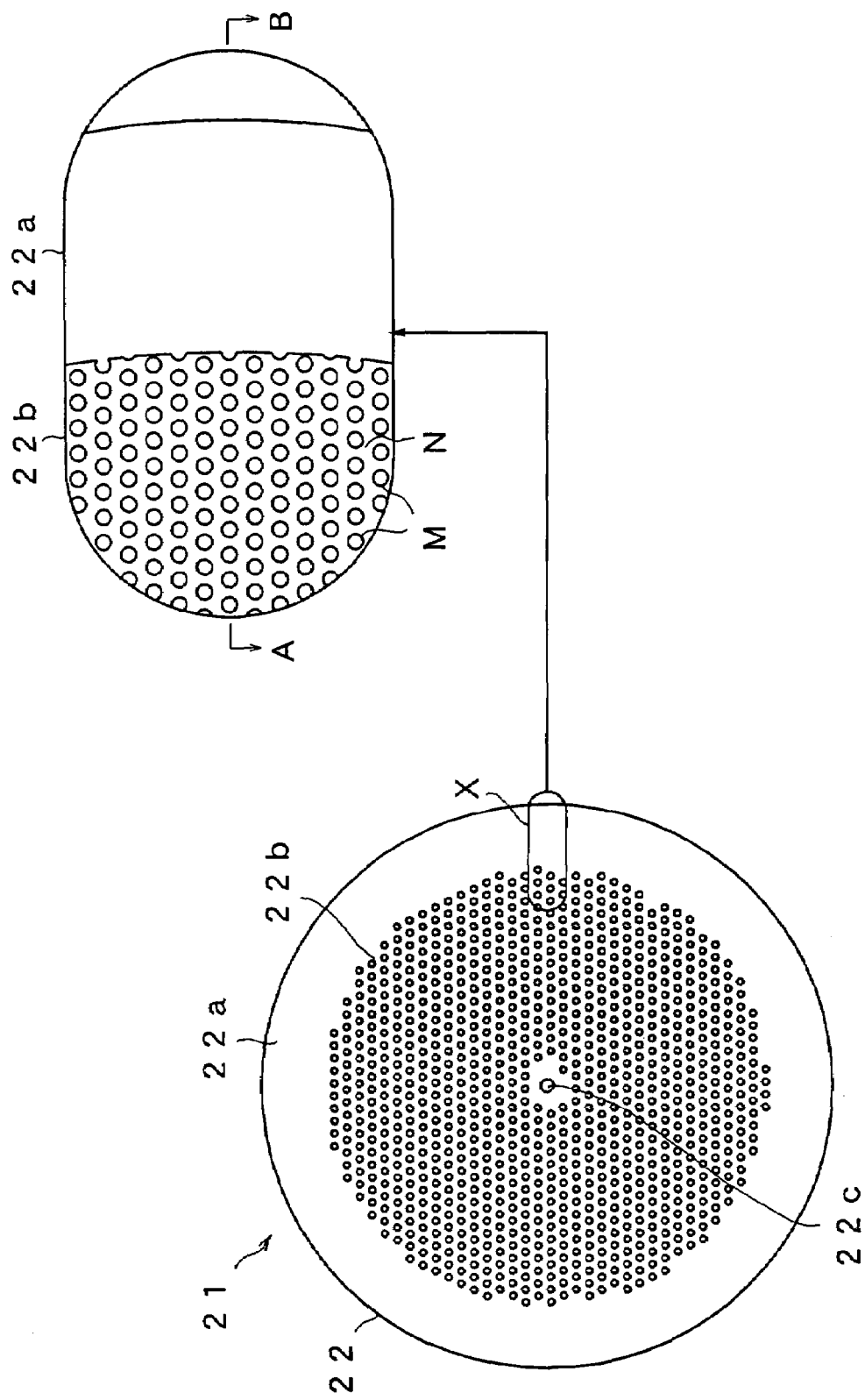
FIG. 6 is a plan view of a suction disk of the vacuum suction pad of the second conventional example as seen from the below.

The vacuum suction pad 31 has a similar structure to the structure of the vacuum suction pad shown in FIGS. 6 and 7, which is a multilayer structure where a suction disk 33 and a reinforcement layer 34 are joined with a double-faced adhesive sheet 35a. The suction disk 33 has an airtight part 33a on a peripheral flat surface and a suction part 33b where a larger number of protruded portions and recessed portions are formed.

The suction disk 33 is formed into a disk shape and is made of a photosensitive resin material, a central portion of which is provided with an opening 33d as part of a vertically penetrating suction port 36. The large number of protruded portions and recessed portions in the suction part 33b are formed by etching the photosensitive resin material. As the photosensitive resin material, AFP as a printing plate material is used, for example. In this AFP, protruded portions and recessed portions can be selectively formed with the use of ultraviolet irradiation and a solvent. It should be noted that the material for the suction disk 33 is not restricted to the printing plate material so long as being a photosensitive resin material. Metal plates, ceramic and the like can also be etched, and if a similar processing method to this etching is applicable, such a method may be employed.

In the case of using the photosensitive resin material, a film with a desired pattern printed thereon is bonded as a mask to the surface of a sheet-shaped photosensitive resin plate. The bonded film is irradiated with (exposed to) ultraviolet rays, and thereafter, the photosensitive resin is etched (developed) with a treatment liquid. In such a manner, places other than the patterned places are etched to form recessed portions whereas the patterned places through which no light is transmitted are not etched to be left as protruded portions.

The distribution density of the protruded portions is from 10 to 250 mesh/inch$^2$, and the sizes of the individual protruding portions are set such that the area ratio of the whole protruded portions to the suction part 33b is from 10 to 50%. Further, the depth of the recessed portion (etched depth) is sufficiently large when it is from tens of μm to hundreds of μm. It should be noted that the shape of the protruded portions is not restricted to a circle, and an arbitrary shape, such as a polygon, may also be applied.

The airtight part 33a is a region of the photosensitive resin material which is not etched. Herein, since neither the protruded portions nor the airtight part 33a are etched, they are positioned on the same surface. Further, the inner circumferential side of the airtight part 33a is provided with an annular groove 33c as another recessed portion. Moreover, the center of the suction disk 33 is provided with the opening 33d, through which a cross-shaped groove 33e is formed. These grooves are communicated with the opening 33d and serve as passages when air present in the recessed portions is discharged.

The reinforcement layer 34 is a layer bonded to the suction disk 33 so as to prevent deformation of the photosensitive resin material constituting the suction disk 33 due to an external stress. This layer is bonded via a double-faced adhesive sheet 35a in the stage of manufacturing the photosensitive resin material into a plate-making material. The central portion of the reinforcement layer 34 is also provided with an opening.

The skirt pad 32 is an elastic member newly provided in the present invention, which is rubber obtained by integral formation of a plate part 32a, an annular part 32b and a skirt part 32c. The plate part 32a is a disk-shaped holding member for holding the vacuum suction pad 31 via a double-faced adhesive sheet 35b, and the diameter thereof is sufficiently larger than the outer diameter of the vacuum suction pad 31. The center of the plate part 32a is also provided with an opening, which is communicated with the opening of the vacuum suction pad 31 to form the suction port 36. The annular part 32b is formed thick and annularly on the outer edge of the plate part 32a so as to surround the vacuum suction pad 31 at a prescribed spacing, and the lower surface of the annular part 32b is formed in a position higher than the lower surface of the vacuum suction pad 31 such that the vacuum suction pad 31 protrudes downward from the annular part 32b. The skirt part 32c is a thin annular rubber member conically expanded, with the annular part 32b as the root, in the direction facing the substrate. An example of this rubber member includes nitrile rubber.

The skirt pad 32 serves to widen the air-discharging space on the periphery of the suction part when sucking the substrate, so as to widen the clearance between the vacuum suction pad 31 and the substrate at which the suction is possible. Since the skirt part 32c is thin, when the vacuum suction head 30A is brought close to the substrate, the peripheral portion of the vacuum suction head 30A is brought into contact with the substrate to be elastically deformed. As thus described, the skirt part 32c of the skirt pad 32 exerts a sealing function of blocking the air flowing in from the outside by the contact with the substrate.

A slit 32d is a cut provided in the annular part 32b so as to leak the air between the outside and the inside of the skirt. This slit 32d can be realized by making a cut with the use of a thin blade in part of the side surface of the skirt pad 32 after formation.

It is to be noted that the slit 32d is not restricted to this formation method and shape. The slit 32d may be a through hole small enough to hold the inside space in a negative pressure state after the skirt pad 32 comes into contact with the glass substrate till the vacuum suction pad 31 comes into contact with the substrate, and not to interfere with the suction of the substrate by the vacuum suction pad 31, and may for example be a round hole with a microdiameter.

Further, the lower surface of the annular part 32b is positioned higher than the lower surface of the vacuum suction pad 31 such that the vacuum suction pad 31 protrudes downward from the annular part 32b. Hence the annular part 32b does not come into contact with the liquid crystal panel 2 even when the vacuum suction pad 31 comes into contact with the liquid crystal panel 2. This can prevent deformation of the annular part 32b to close the slit 32d.

Figure 13:
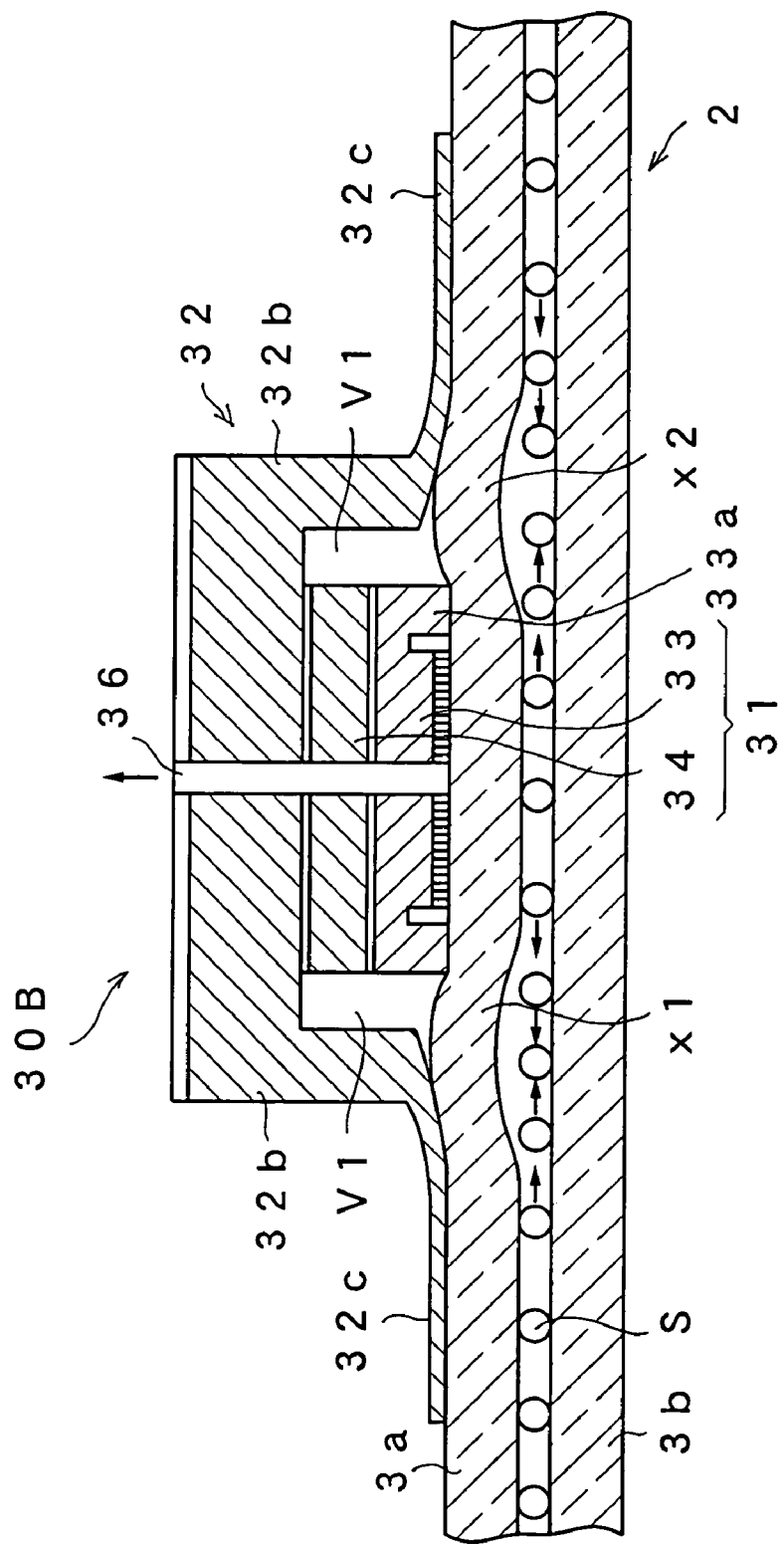
FIG. 13 is a cross-sectional view showing a state of sucking the liquid crystal panel when a slit-free vacuum suction head is used.

Herein, the function of the slit 32d will be further described. A vacuum suction head of the type without the slit 32d is referred to as a vacuum suction head 30B. FIG. 13 is a cross-sectional view showing a state where the vacuum suction head 30B sucks the liquid crystal panel 2. As described above, the liquid crystal panel 2 is in a state where a constant gap is held between the upper glass substrate 3a and the lower glass substrate 3b via spacers S. When the vacuum suction head 30B is brought close to the liquid crystal panel 2 and air is discharged from the suction port 36, as shown in the figure, the skirt part 32c adheres to the liquid crystal panel 2 and the space covered with the skirt part 32c is held in a negative pressure state. In course of time, the suction disk 33 also adheres to the liquid crystal panel 2 and the air is further discharged to act suction force upon the liquid crystal panel 2.

A space V1 generates since the vacuum suction pad 31 is positioned lower than the lower end of the annular part 32b and the lower surface of the annular part 32b as the root of the skirt part 32c is positioned higher than the lower surface of the vacuum suction pad 31. The space V1 is formed of a spacing between the vacuum suction pad 31 and the annular part 32b, and the space V1 becomes even wider when the difference between the outer diameter of the vacuum suction pad 31 and the inner diameter of the annular part 32b is large. As described in the conventional example, the glass substrates 3a and 3b have a thickness as thin as 0.5 to 1.1 mm, and when the negative pressure is acted thereon, the upper glass substrate 3a is locally deformed upward in portions x1 and x2, as shown in FIG. 13. In such a state, the gap between the upper glass substrate 3a and the lower glass substrate 3b widens, and the spacers S then move to the portions x1 and x2 where the gap has widened. Moreover, there exists a liquid crystal panel of FIG. 13 of the type with no spacer S inserted between the upper and lower glass substrates in the liquid crystal panel 2. Also in the case this spacer-free type liquid crystal panel is vacuum-sucked by a suction head 30B, the upper glass substrate 3a is locally deformed upward and once deformed, it does not returns to the original state, to cause occurrence of variations in the gap between the upper and lower glass substrates, thereby leading to appearance of a color shading on the display surface, and hence the liquid crystal panel becomes defective as a product.

Figure 14:
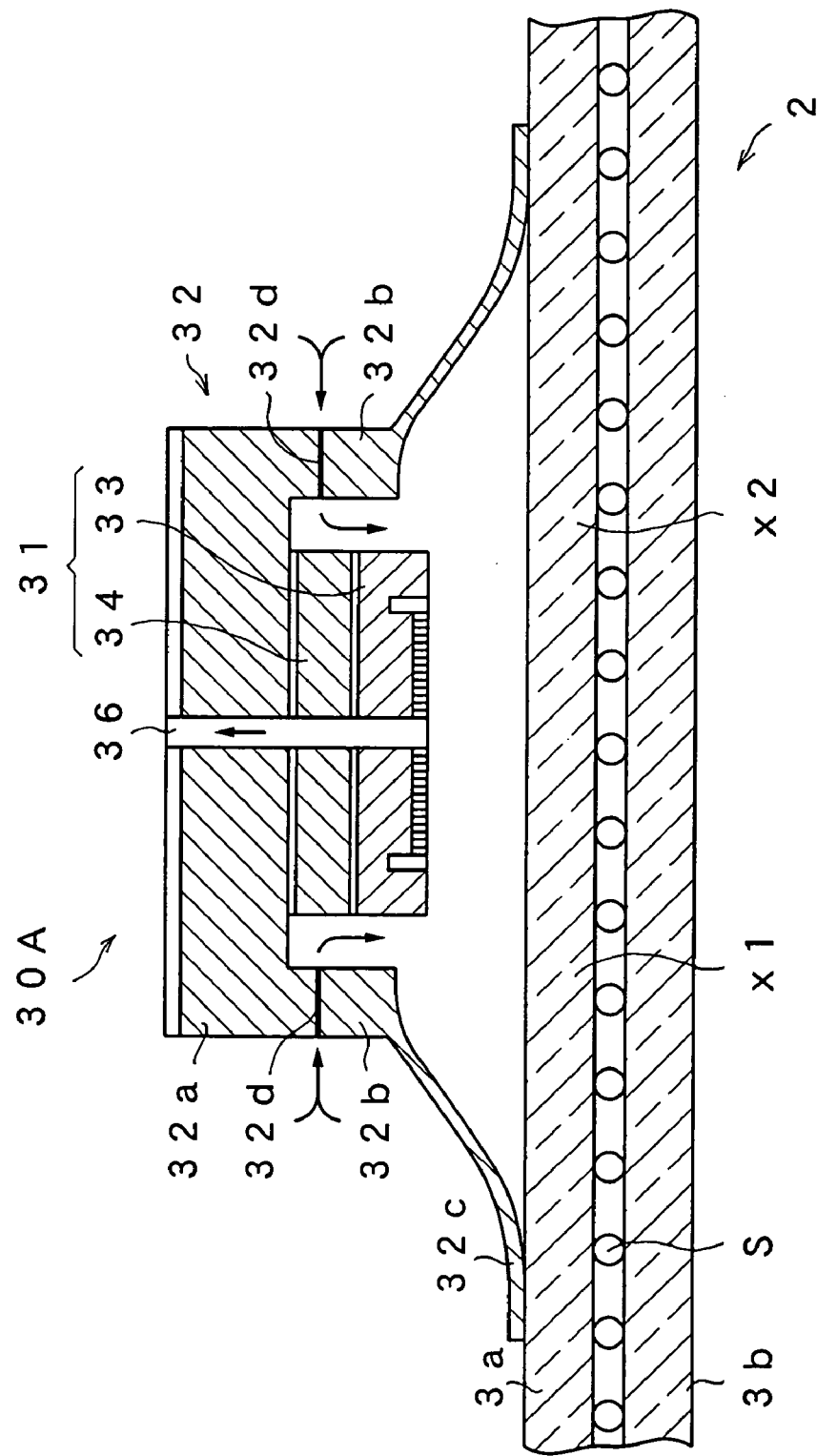
FIG. 14 is a cross-sectional view showing a transitional state of sucking the liquid crystal panel when the vacuum suction head in Embodiment 1 of the present invention is used.
Figure 15:
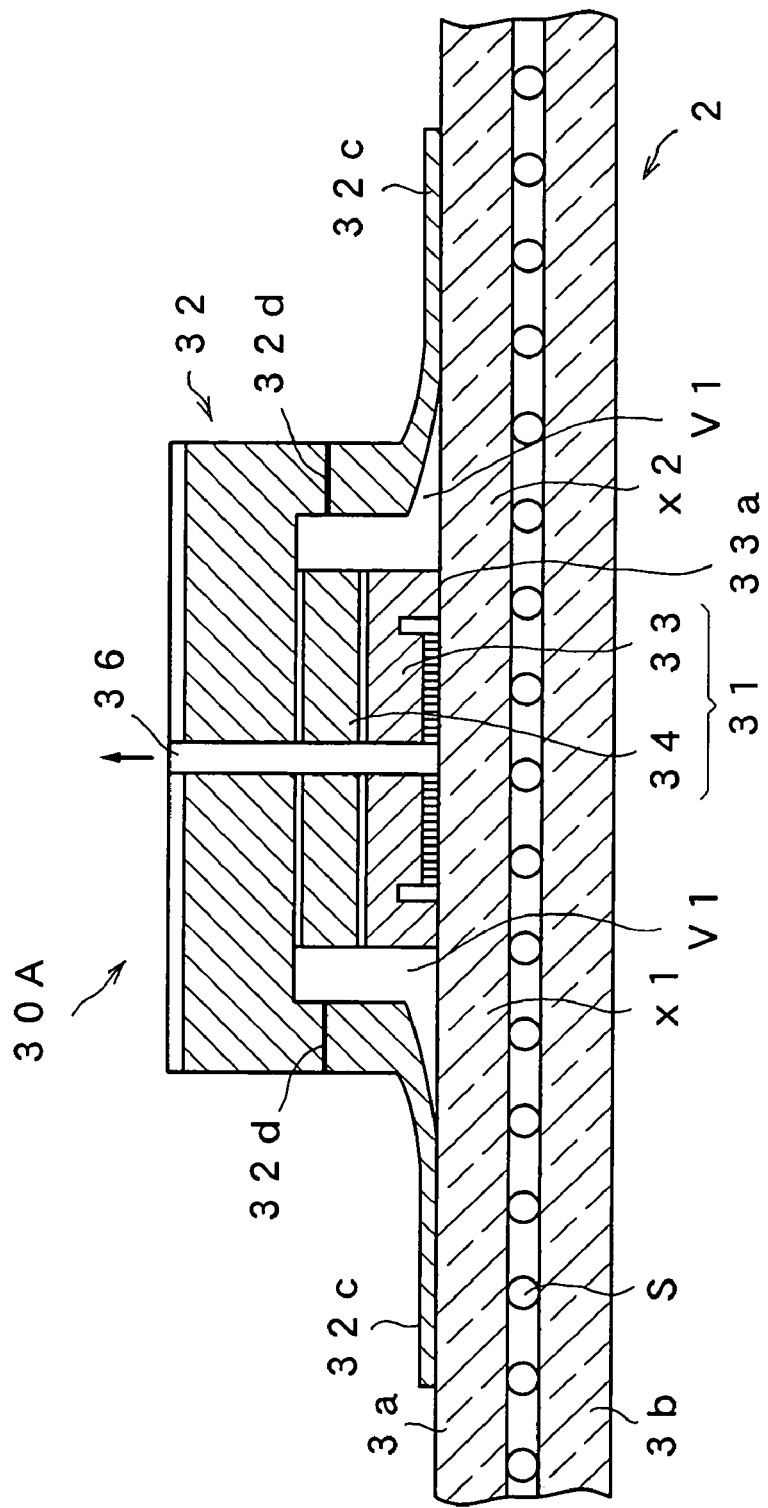
FIG. 15 is a cross-sectional view showing a state of sucking the liquid crystal panel when the vacuum suction head in Embodiment 1 of the present invention is used.

In order to solve this problem, as shown in FIG. 11, the skirt pad 32 is provided with the slit 32d for air-inspiration. The vacuum suction pad 31 is provided so as to protrude downward from the annular part 32b such that the annular part 32b is prevented from being deformed to close the slit 32d even with the vacuum suction pad 31 brought into contact with the liquid crystal panel 2. Therefore the lower surface of the annular part 32b is positioned higher than the lower surface of the vacuum suction pad 31. FIG. 14 shows a transitional state of sucking the liquid crystal panel by the vacuum suction head 30A, and FIG. 15 shows a steady sucking state.

When the air is discharged through the suction port 36 to suck the liquid crystal panel 2, as shown in FIG. 14, first, the skirt part 32c is brought into contact with the liquid crystal panel 2. When the air continues to be discharged in this state, the pressure in the space covered with the skirt part 32c and the upper glass substrate 3a becomes negative. This causes elastic deformation of the skirt part 32c to increase a contact area between the skirt part 32c and the upper glass substrate 3a. Further, since the negative pressure inside the skirt part 32c becomes larger, the air begins to be leaked from the outside through the slit 32d.

Although this causes decreased negative pressure on the periphery of the suction disk 33, the negative pressure in such a degree does not prevent the vacuum suction pad 31 from sucking the liquid crystal panel 2, and the liquid crystal panel 2 is thus sucked by the vacuum suction pad 31. When the air-discharging further continues, as shown in FIG. 15, the suction disk 33 of the vacuum suction pad 31 is brought into contact with the liquid crystal panel 2. In such a state, the negative pressure upon the upper glass substrate 3a of the suction disk 33 further increases due to the sealing function of the airtight part 33a. The suction disk 33 thus comes into a state of being capable of singly sucking and holding the liquid crystal panel 2. Thereafter, the outside air is further leaked through the slit 32d into the space V1, to eliminate the negative pressure. When the suction is performed in such a manner, the pressure in the space V1 is kept almost equivalent to the outside pressure, and the upper glass substrate 3a is not locally deformed as in FIG. 13. Therefore, the spacers S do not move and it is thus possible to suck and hold the liquid crystal panel 2 while holding the gap between the glass substrates in a uniform state.

In the case a brittle material substrate having a large outer shape is sucked using a plurality of vacuum suction heads 30A with the structure thus described, the distance at which suction is possible becomes longer than that in the conventional example, and in one example, the distance was from 0.0 to 2.0 mm. Therefore, even with the brittle material substrate swollen or bent in some degree, it was possible for the suction disk 33 to follow so as to hold the substrate with certainty.

Embodiment 2

Figure 16:
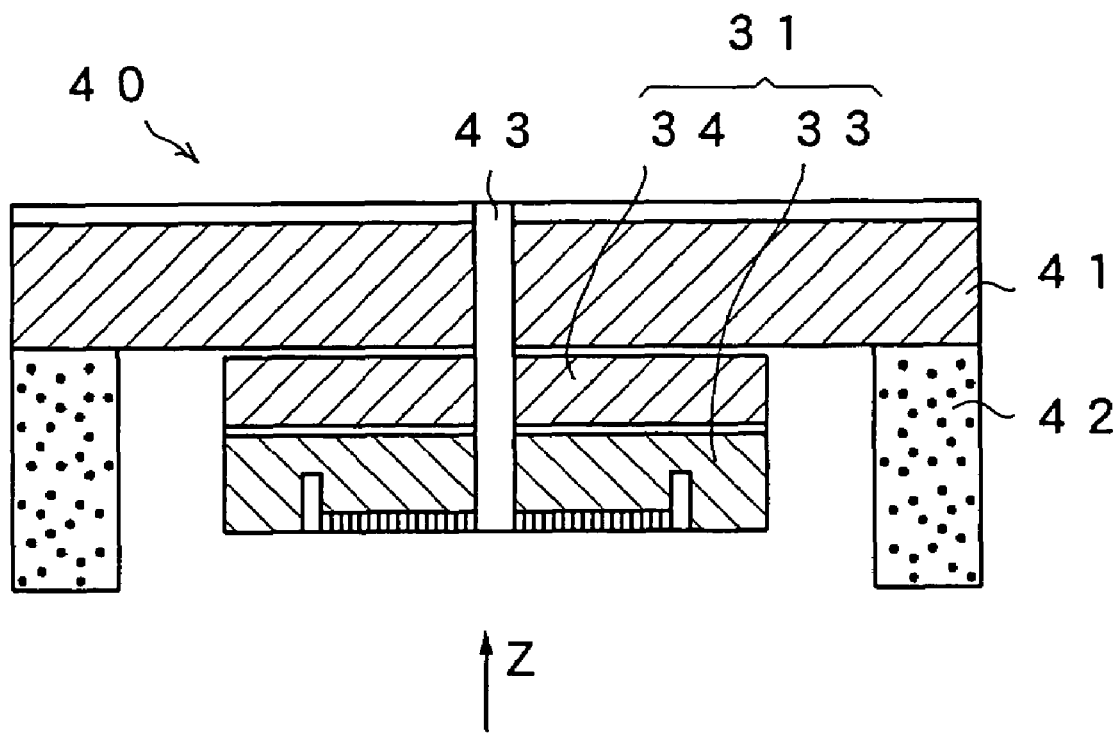
FIG. 16 is an end view showing a structure of a vacuum suction head in Embodiment 2 of the present invention.

Next, a vacuum suction head in Embodiment 2 of the present invention will be described with reference to the drawings. FIG. 16 is an end view showing a structure of a vacuum suction head 40 in Embodiment 2. The vacuum suction head 40 includes the vacuum suction pad 31, a plate part 41 and a sponge pad 42. The vacuum suction pad 31 and the sponge pad 42 are concentrically attached to the plate part 41.

Since the structure of the vacuum suction pad 41 is the same as that shown in FIGS. 11 and 12, descriptions on the constituents thereof are omitted. The sponge pad 42 is an elastic member having the same function as the skirt pad 32 shown in FIG. 11. The sponge pad 42 is made of porous rubber and is cylindrically formed. As the porous rubber, especially one with large loss of pressure is used. Used herein is a sponge body of EPT (Ethylene Propylene Terpolymer) which is excellent in weather resistance, heat resistance and aging resistance. As the sponge body, an open-cell foamed type with a desired pressure loss is preferably used. When a center axis of the vacuum suction pad 31 is z, the height of the sponge pad 42 in the z direction in a non-deformed state is slightly larger than the thickness of the vacuum suction pad 31 in the z direction. The center axis of the vacuum suction pad 31 is provided with a suction port 43.

Figure 17:
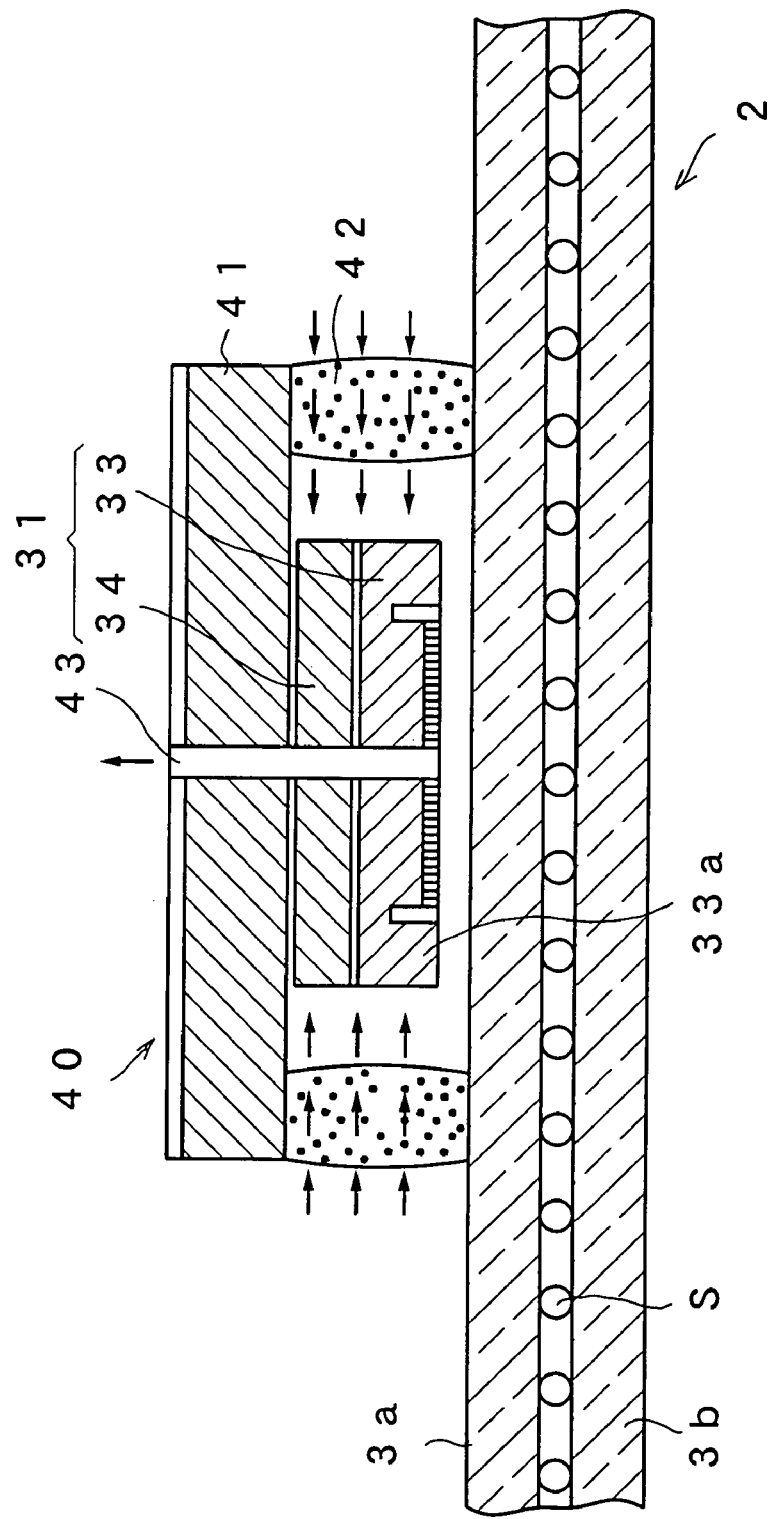
FIG. 17 is a cross-sectional view showing a transitional state of sucking the liquid crystal panel when the vacuum suction head in Embodiment 2 is used.
Figure 18:
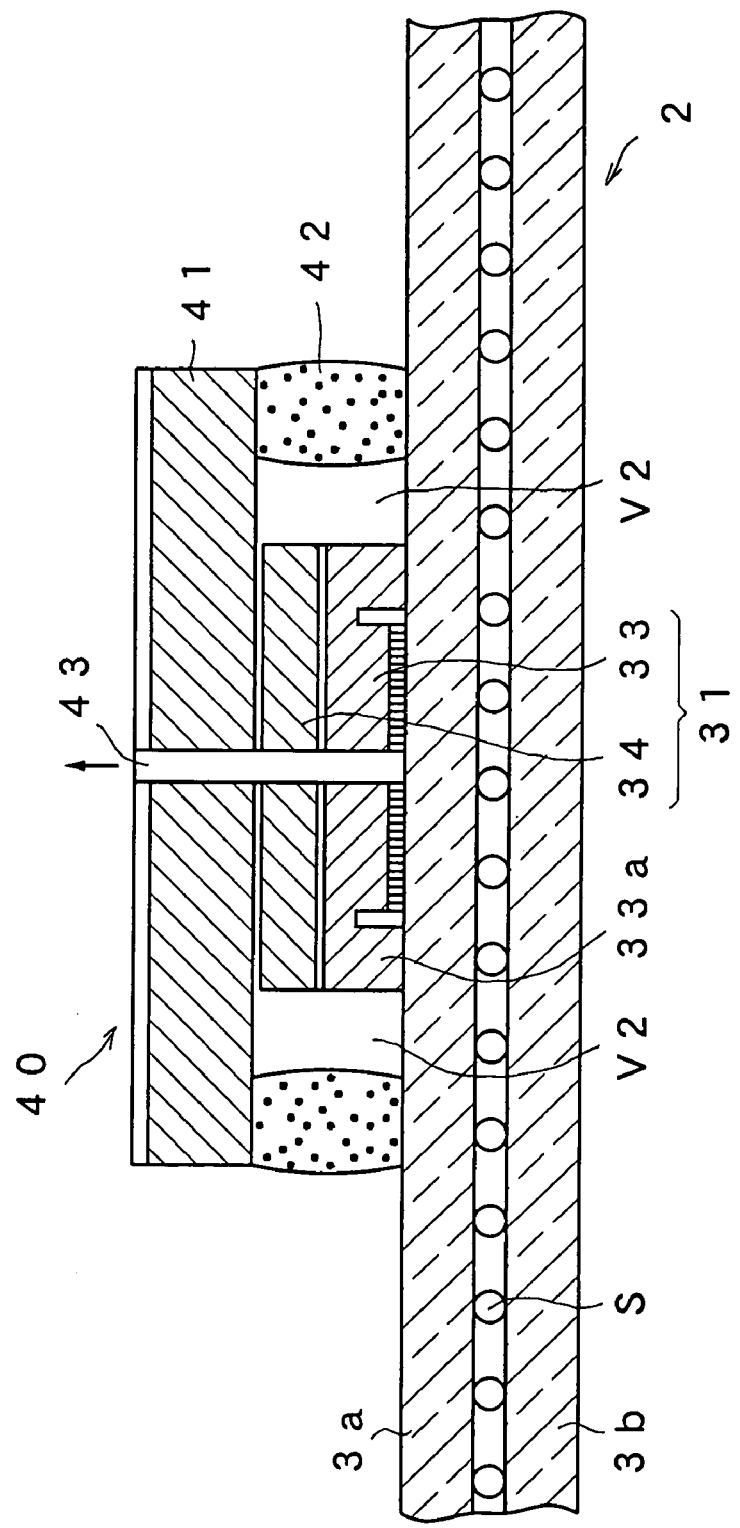
FIG. 18 is a cross-sectional view showing a state of sucking the liquid crystal panel when the vacuum suction head in Embodiment 2 is used.

FIG. 17 shows a transitional state of sucking the liquid crystal panel 2 by the vacuum suction head 40, and FIG. 18 shows a steady sucking state. When the vacuum suction head 40 is brought close to the liquid crystal panel 2, as shown in FIG. 17, first, the lower end of the sponge pad 42 is brought into contact with the upper glass substrate 3a, and the sponge pad 42 is bent due to the elasticity thereof in such a direction as to increase the thickness thereof. When the air is discharged from the suction port 43, pressure of a closed space covered with the sponge pad 42 becomes negative, and due to the difference between the outside pressure and the inside pressure of the sponge pad 42, the air flows into the closed space from the outside as indicated by arrows in FIG. 17. However, the flowing of the air inside does not cause a decrease in negative pressure of the closed space in such a degree as to prevent the vacuum suction pad 31 from sucking the liquid crystal panel 2. In this manner, the liquid crystal panel 2 is further sucked by the vacuum suction pad 31, and as shown in FIG. 18, the suction disk 33 of the vacuum suction pad 31 is brought into contact with the liquid crystal panel 2. At this time, due to the sealing function of the airtight part 33a, the suction disk 33 has negative pressure upon the upper glass substrate 3a large enough to singly suck and hold the liquid crystal panel 2. On the other hand, the outside air is flown into a space V2 between the sponge pad 42 and the vacuum suction pad 31 due to the difference between the outside pressure and the inside pressure of the sponge pad 42, and thereby the negative pressure of the space V2 is instantly eliminated. Therefore, the upper glass substrate 3a in this portion is no longer locally deformed upward. Accordingly, the spacers S do not move, and it is thus possible to suck and hold the liquid crystal panel 2 with certainty while holding the gap between the glass substrates in a uniform state.

In the case a brittle material substrate having a large outer shape is sucked using a plurality of vacuum suction heads 40 with the structure thus described, the distance at which the suction is possible becomes longer than that in the conventional example. In one example, the distance was from 0.0 to 2.0 mm, and even with the brittle material substrate swollen or bent in some degree, it has become possible for the suction disk 33 to follow so as to hold the brittle material substrate with certainty.

Figure 19:
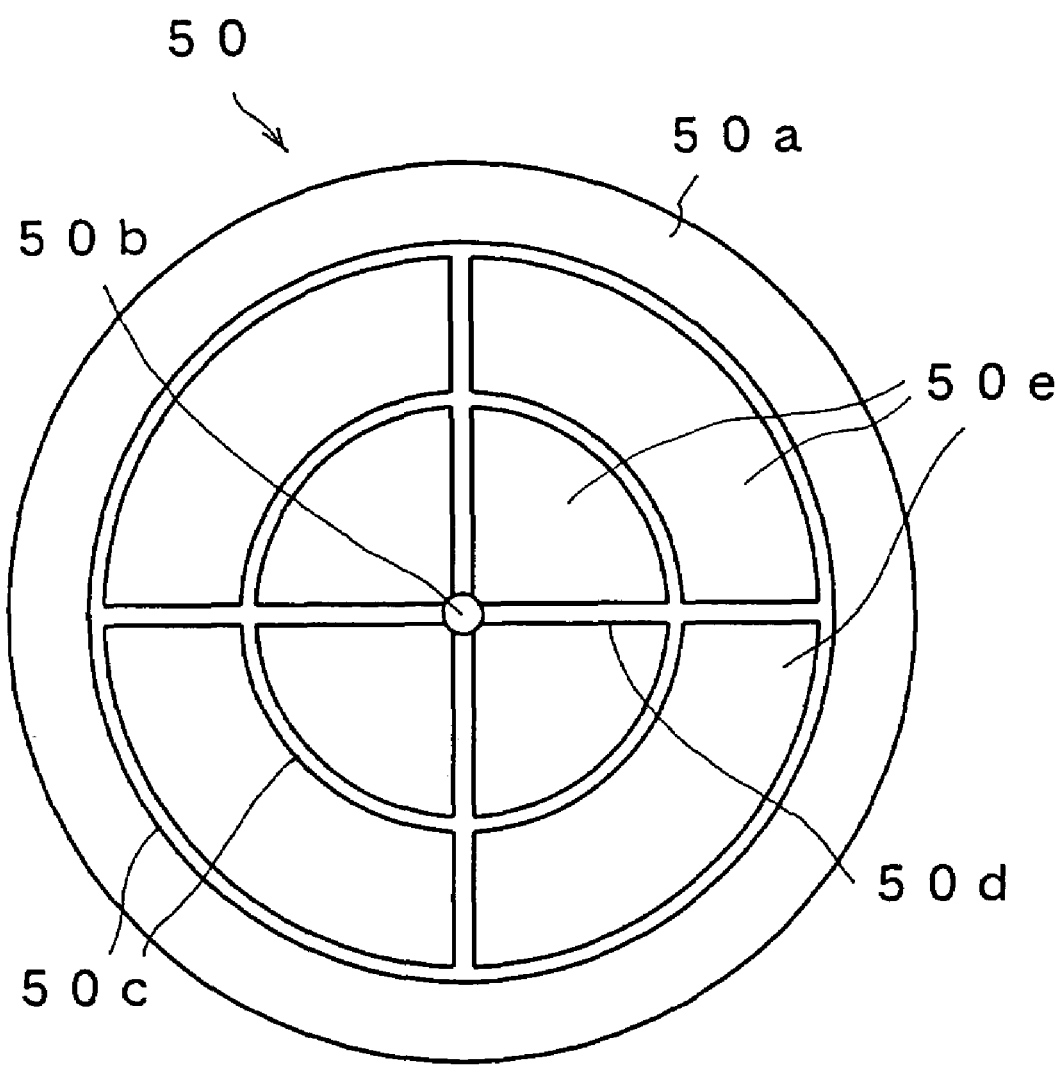
FIG. 19 is a plan view showing a structure of another suction disk for use in a vacuum suction head in each embodiment.

It should be noted that, as the vacuum suction pad in Embodiments 1 and 2, minute protruded portions were left and recessed portions communicated with one another by etching were formed in the suction part, as shown in FIG. 12. However, as shown in FIG. 19, a large number of grooves may be formed and portions surrounded with the grooves may be the protruded portions, in place of forming minute protruded portions. In a suction disk 50 shown in FIG. 19, the peripheral portion is an airtight part 50a, and a plurality of grooves 50c are concentrically formed by etching with an opening 50b at the center, and a groove 50d is formed in cross shape by etching so as to cross over the opening 50b. The regions not etched are protruded portions 50e. Also in the suction disk 50 with such a structure, the same suction effect as those in Embodiments 1 and 2 is obtained and the distance at which the suction is possible is also increased.

It should be noted that, although the liquid crystal panel was mainly used as the substrate in the descriptions on Embodiments 1 and 2, the vacuum suction head of the present invention is effectively applicable to a single-plate semiconductor wafer, a ceramic substrate, a glass substrate, a plastic substrate, a transmissive-type projector substrate which is a laminated substrate, a reflective-type liquid projector substrate, a plasma display panel (PDP) which is a flat panel display, a liquid crystal panel, an organic EL element substrate, and the like, since the vacuum suction head can suck these substrates without causing local deformation thereof. Further, although the case where spacers are inserted between the two glass substrates in the liquid crystal panel and the mother liquid crystal panel was described, the vacuum suction head of the present invention is effectively applicable also to a liquid crystal panel and a mother liquid crystal panel with no spacer inserted therein.

INDUSTRIAL APPLICABILITY

According to the present invention, since the elastic member is provided with the peripheral portion of the suction disk, it is possible to promptly and stably make the pressure negative on the periphery of the suction disk immediately before the suction of the substrate. Subsequently, as the suction disk adheres to the substrate, the substrate is held such that the suction force of the suction disk on the substrate further increases. In such a manner, a clearance at which the substrate can be sucked by the suction disk (i.e. clearance between the substrate and the suction surface of the suction disk) widens, thereby preventing occurrence of defective suction when a substrate having a large shape is sucked using a plurality of suction disks. Moreover, it is possible to prevent local deformation of the substrate that occurs at the time of sucking the substrate, and in the case of a laminated substrate, it is possible to prevent variations in the gap between the substrates caused by the above-mentioned local deformation of the substrate. Furthermore, since the elastic member absorbs the local deformation of the substrate that occurs at the time of suction to allow the substrate to adhere to the suction disk with stable suction force, stable suction is possible when a large substrate is sucked using a plurality of suction disks. Such a vacuum suction head is preferably applicable to a substrate scribing device and a substrate conveying device.

The invention claimed is:

1. A vacuum suction head for vacuum-sucking a substrate, comprising:
   a vacuum suction pad including a suction part having a plurality of independent protruded portions and recessed portions formed on a surface thereof, an airtight part annularly formed in a peripheral position of said suction part, a groove part providing a passage for discharging air from said suction part, and an opening enclosed by said airtight part for discharging the air from said groove part to the outside; and
   a skirt pad formed so as to take in said vacuum suction pad, said skirt pad blocking outside air from a peripheral space of said vacuum suction pad when said vacuum suction pad comes close to a substrate to be sucked, wherein said skirt pad comprises:
   a plate part, said plate part supporting said suction part;
   an annular part formed of a thick annular shape on an outer edge of said plate part, said annular part surrounding a peripheral portion of said vacuum suction pad to define an inner space between said annular part and said vacuum suction pad; and
   a skirt part formed of a conically annular shape, said skirt part having a thickness smaller than thickness of a peripheral portion of said annular part, said annular part and said plate part defining a slit for communicating outside of said annular part with said inner space, whereby air passes from said outside into said inner space when a pressure difference exists between said outside and said inner space, said annular part having an annular part bottom surface, said vacuum suction pad having a bottom suction pad surface, said annular part bottom surface being formed at a position that is higher than a position of said bottom suction pad surface such that said slit remains permanently open.

2. The vacuum suction head according to claim 1, wherein:
   said plurality of protruded portions and recessed portions are formed on one surface of said suction part by etching, and
   said airtight part is annularly formed on the peripheral portion of said suction part as a non-etching region.

3. The vacuum suction head according to claim 2, wherein said vacuum suction pad is composed of a photosensitive resin material which can be selectively etched with the use of ultraviolet irradiation and a solvent.

4. The vacuum suction head according to claim 1, wherein said annular part is located at a spaced location from said airtight part.

5. A vacuum suction head for vacuum-sucking a substrate, the vacuum suction head comprising:
   a vacuum suction pad including a suction part having a plurality of protruded portions and recessed portions formed on a surface thereof;
   an airtight part having an annular shape, said airtight part being connected to a periphery of said suction part;
   a groove defined by said surface of said suction part;
   an opening defined by said airtight part, said opening being in communication with said groove;

a skirt pad including a skirt part formed of a conically annular shape, a plate part and an annular part, said skirt pad preventing outside air from entering a space defined by said skirt pad and said vacuum suction part when said skirt pad is in contact with the substrate, said plate part being connected to said suction part, said annular part being connected to said plate part and said skirt part, said annular part having a thickness greater than a thickness of said skirt part;

a slit defined by said annular part and said plate part for communicating the outside of said annular part with said space, whereby air passes from said outside into said space when a pressure difference exists between said outside and said inner space, said annular part having a lower annular part surface, said suction part having a lower suction part surface, said lower annular part surface being located at a distance from the substrate that is greater than a distance between said lower suction part surface and the substrate when said skirt pad is in contact with the substrate and when said skirt pad is not in contact with the substrate, wherein said lower annular part surface does not contact the substrate when said skirt pad is in contact with the substrate such that said slit remains open when said skirt pad is in contact with the substrate and when said skirt pad is not in contact with the substrate;

a suction port defined by said suction pad and said skirt pad, said suction port being in communication with said opening, whereby air is discharged from said groove through said opening to the outside via said suction port.

6. The vacuum suction head according to claim 5, wherein said vacuum suction pad is composed of a photosensitive resin material.

7. The vacuum suction head according to claim 5, wherein said annular part is located at a spaced location from said airtight part.

8. A vacuum suction head for vacuum-sucking a substrate, the vacuum suction head comprising:

a vacuum suction pad including a suction part having a plurality of protruded portions and recessed portions formed on a surface thereof;

an airtight part having an annular shape, said airtight part being connected to a periphery of said suction part;

a groove defined by said surface of said suction part;

an opening defined by said airtight part, said opening being in communication with said groove;

a skirt pad including a skirt part formed of a conically annular shape, a plate part and an annular part, said skirt pad preventing outside air from entering a space defined by said skirt pad and said vacuum suction part when said skirt pad is in contact with the substrate, said plate part being connected to said suction part, said annular part being connected to said plate part and said skirt part, said annular part having a thickness greater than a thickness of said skirt part;

a slit defined by said annular part and said plate part for communicating the outside of said annular part with said space, whereby air passes from said outside into said space when a pressure difference exists between said outside and said inner space, said surface of said suction part being located at a position lower than a position of a surface of said annular part when said suction part is in contact with the substrate and when said suction part is not in contact with the substrate such that said annular part does not deform when said suction part is in contact with the substrate and when said suction part is not in contact with the substrate, wherein said slit remains permanently open when said suction part is in contact with the substrate and when said suction part is not in contact with the substrate, said surface of said annular part being located at a spaced location from the substrate when said suction part is in contact with the substrate such that said surface of said annular part does not contact the substrate when said suction part is in contact with the substrate;

a suction port defined by said suction pad and said skirt pad, said suction port being in communication with said opening, whereby air is discharged from said groove through said opening to the outside via said suction port.

9. The vacuum suction head according to claim 8, wherein said vacuum suction pad is composed of a photosensitive resin material.

10. The vacuum suction head according to claim 8, wherein said annular part is located at a spaced location from said airtight part.

* * * * *